(12) United States Patent
Oda et al.

(10) Patent No.: US 12,298,126 B2
(45) Date of Patent: May 13, 2025

(54) OPERATION ACCURACY MEASURING METHOD

(71) Applicant: DISCO CORPORATION, Tokyo (JP)

(72) Inventors: Atsushi Oda, Tokyo (JP); Yoshinobu Saito, Tokyo (JP); Hirohide Yano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 37 days.

(21) Appl. No.: 17/805,159

(22) Filed: Jun. 2, 2022

(65) Prior Publication Data

US 2022/0397387 A1 Dec. 15, 2022

(30) Foreign Application Priority Data

Jun. 15, 2021 (JP) .................................. 2021-099330

(51) Int. Cl.
*G01B 3/30* (2006.01)
*B23Q 17/22* (2006.01)
(Continued)

(52) U.S. Cl.
CPC ........... *G01B 3/30* (2013.01); *B23Q 17/2233* (2013.01); *B25J 9/1692* (2013.01); *G01B 5/0004* (2013.01);
(Continued)

(58) Field of Classification Search
CPC ... G01B 11/04; G01B 11/043; G01B 11/2441; G01B 11/2518; G01B 5/0002;
(Continued)

(56) References Cited

U.S. PATENT DOCUMENTS 1,490,927 A * 4/1924 Johansson ................. G01B 3/56
33/423
2,134,062 A * 10/1938 Trbojevich ............... G01B 3/56
33/567
(Continued)

FOREIGN PATENT DOCUMENTS

CN 203758400 U * 8/2014
CN 104227507 A * 12/2014 ......... B23Q 17/2233
(Continued)

OTHER PUBLICATIONS

Plexpert: The Plastic Expert (May 18, 2021), Angle gauge block. Available at: https://www.plexpert.ca/glossary/angle-gauge-block/ (Year: 2021).*

(Continued)

*Primary Examiner* — Gordon J Stock, Jr.
(74) *Attorney, Agent, or Firm* — Greer Burns & Crain Ltd.

(57) ABSTRACT

An operation accuracy measuring method for measuring the operation accuracy of a linear motion mechanism includes the steps of placing on a support table a measuring jig having a flat lower surface, a parallel surface opposite and parallel to the lower surface, and a slanted surface joined to the parallel surface through a straight boundary line, adjusting the position of the measuring jig to allow the white light interferometer to observe the parallel surface and the slanted surface simultaneously, capturing images of the parallel surface and the slanted surface with the white light interferometer and observing changes in interference fringes appearing in image sections of the captured images that represent the parallel surface and the slanted surface while the support table is being linearly moved, and the step of deducing the operation accuracy of the linear motion mecha- (Continued)

nism on the basis of the observed changes in the interference fringes.

6 Claims, 6 Drawing Sheets

(51) Int. Cl.
*B25J 9/16* (2006.01)
*G01B 5/00* (2006.01)
*G01B 5/24* (2006.01)
*G01B 11/24* (2006.01)
*G01B 11/25* (2006.01)
*G01B 21/20* (2006.01)
*G01B 21/22* (2006.01)
*G05B 19/401* (2006.01)

(52) U.S. Cl.
CPC ......... *G01B 5/0007* (2013.01); *G01B 5/0009* (2013.01); *G01B 5/24* (2013.01); *G01B 11/2441* (2013.01); *G01B 11/2504* (2013.01); *G01B 11/2518* (2013.01); *G01B 21/20* (2013.01); *G01B 21/22* (2013.01); *G05B 19/4015* (2013.01)

(58) Field of Classification Search
CPC .. G01B 5/0004; G01B 5/0007; G01B 5/0009; G01B 11/002; G01B 11/005; G01B 11/24; G01B 11/2504; G01B 5/004; G01B 5/008; G01B 5/24; G01B 5/242; G01B 9/02072; G01B 9/02074; G01B 3/20; G01B 3/30; G01B 3/306; G01B 3/56; G01B 21/20; G01B 21/22; G01B 21/042; G01B 21/04; G05B 19/401; G05B 19/4015; G01C 25/00; G01C 1/00; G01C 1/02; B25J 9/1692; B23Q 17/002; B23Q 17/003; B23Q 17/22; B23Q 17/2208; B23Q 17/2216; B23Q 17/2225; B23Q 17/2233; B23Q 17/2241

See application file for complete search history.

(56) References Cited

U.S. PATENT DOCUMENTS

| | | | | | |
|---|---|---|---|---|---|
| 2,409,936 | A | * | 10/1946 | Hunt | B23Q 3/104 269/95 |
| 2,487,667 | A | * | 11/1949 | Nippert | G01B 3/30 33/567 |
| 2,536,401 | A | * | 1/1951 | Victor | G01B 3/30 D10/64 |
| 2,601,630 | A | * | 6/1952 | Rahn | G01B 3/30 451/41 |
| 2,712,695 | A | * | 7/1955 | Aller | G01B 3/30 33/567 |
| 4,188,544 | A | * | 2/1980 | Chasson | G01B 11/2504 144/357 |
| 4,336,656 | A | * | 6/1982 | Lewis | G01B 3/56 33/532 |
| 4,498,778 | A | * | 2/1985 | White | G01B 11/25 356/243.4 |
| 4,682,894 | A | * | 7/1987 | Schmidt | G01B 11/306 356/243.4 |
| 4,908,777 | A | * | 3/1990 | Wolfe | B25J 9/1692 901/50 |
| 4,979,815 | A | * | 12/1990 | Tsikos | G01B 11/2522 434/4 |
| 5,329,703 | A | * | 7/1994 | Craig | G01B 5/242 33/502 |
| 5,671,541 | A | * | 9/1997 | Dai | G01B 3/30 33/502 |
| 6,055,056 | A | * | 4/2000 | Kuehmstedt | G01B 11/2504 356/243.4 |
| 6,457,248 | B1 | * | 10/2002 | Rishton | G01B 5/241 33/531 |
| 6,671,973 | B2 | * | 1/2004 | Takemura | G01B 5/0004 73/104 |
| 6,822,748 | B2 | * | 11/2004 | Johnston | G01B 21/042 356/243.1 |
| 6,833,163 | B1 | * | 12/2004 | Krenkel | C04B 35/573 427/380 |
| 7,869,026 | B2 | * | 1/2011 | Boyer | G01B 21/042 356/243.1 |
| 8,700,369 | B2 | * | 4/2014 | Yang | G06G 7/48 700/192 |
| 9,372,079 | B1 | * | 6/2016 | Wu | G01B 11/005 |
| 9,952,185 | B1 | * | 4/2018 | Delhomme | G01N 29/07 |
| 10,345,101 | B2 | * | 7/2019 | Haverkamp | G01B 1/00 |
| 10,661,442 | B2 | * | 5/2020 | Wang | B25J 9/1697 |
| 10,675,725 | B2 | * | 6/2020 | Pettersson | G01B 7/14 |
| 10,801,824 | B1 | * | 10/2020 | Haines | G01B 3/30 |
| 2001/0007502 | A1 | | 7/2001 | Kanda et al. | |
| 2001/0045021 | A1 | * | 11/2001 | Matsuda | G01B 21/042 73/1.79 |
| 2007/0041022 | A1 | | 2/2007 | Schluchter | |
| 2012/0084989 | A1 | * | 4/2012 | Pettersson | G01B 21/045 33/503 |

FOREIGN PATENT DOCUMENTS

| | | | | |
|---|---|---|---|---|
| CN | 104596390 | A | * | 5/2015 |
| CN | 109579759 | A | * | 4/2019 |
| CN | 112066839 | A | * | 12/2020 |
| JP | 2001194132 | A | | 7/2001 |
| JP | 2006255826 | A | * | 9/2006 |
| JP | 003126813 | A | | 10/2006 |
| JP | 2006281353 | A | * | 10/2006 ......... B23Q 17/2241 |
| JP | 2008249349 | A | | 10/2008 |
| JP | 2009036589 | A | * | 2/2009 |
| JP | 4786923 | B2 | * | 10/2011 |
| JP | 2017199777 | A | | 11/2017 |
| KR | 100976597 | B1 | * | 8/2010 |
| KR | 20120045257 | A | * | 5/2012 |

OTHER PUBLICATIONS

The Engineering ToolBox (2009). Slope—Degree, Gradient and Grade Calculator. Available at: https://www.engineeringtoolbox.com/slope-degrees-gradient-grade-d_1562.html.*

Search report issued in counterpart Singapore patent application No. 10202205480V, dated Aug. 19, 2024.

Office Action issued in counterpart Japanese patent application No. 2021-099330, dated Dec. 3, 2024.

* cited by examiner

56a

56b

56c

56d

OPERATION ACCURACY MEASURING METHOD

BACKGROUND OF THE INVENTION

Field of the Invention

The present invention relates to a measuring jig, an operation accuracy measuring system, and an operation accuracy measuring method for measuring the operation accuracy of a linear motion mechanism that linearly moves a component.

Description of the Related Art

Device chips that incorporate semiconductor devices are fabricated from semiconductor wafers, packaged substrates, ceramic substrates, glass substrates, or the like. Specifically, a grid of intersecting projected dicing lines is established on the face side of a semiconductor wafer, for example, to demarcate a plurality of areas thereon, and semiconductor devices are formed in the respective areas. Then, the semiconductor wafer is divided along the projected dicing lines into individual device chips incorporating the respective semiconductor devices. The semiconductor wafer is divided using a cutting apparatus, for example. The cutting apparatus includes a chuck table, i.e., a support table, for holding a workpiece such as a semiconductor wafer under suction thereon and a cutting unit for cutting the workpiece held on the chuck table. The chuck table is supported on a table base. The cutting unit has an annular cutting blade. For cutting the workpiece, the cutting apparatus rotates the cutting blade in a plane perpendicular to the face side of the workpiece and moves the cutting unit and the chuck table relatively to each other in a processing feed direction, causing the cutting blade to cut into the workpiece along one of the projected dicing lines. Then, in order to cut the workpiece along another one of the projected dicing lines, the cutting apparatus moves the cutting unit and the chuck table relatively to each other in an indexing feed direction perpendicular to the processing feed direction.

The cutting apparatus includes various moving mechanisms for moving the cutting unit and the chuck table relatively to each other in different directions. More specifically, the cutting apparatus includes linear motion mechanisms such as a processing feed mechanism for moving the chuck table in the processing feed direction and an indexing feed mechanism for moving the chuck table, etc., in the indexing feed direction. The cutting apparatus is unable to perform a desired cutting process on workpieces unless these linear motion mechanisms operate appropriately. Consequently, it is desirable for the cutting apparatus to measure the operation accuracy of the linear motion mechanisms, i.e., to measure pitching and yawing thereof. For measuring the operation accuracy of the linear motion mechanisms, the cutting apparatus uses a measuring jig for measuring pitching and yawing in the vicinity of a processing spot where the cutting blade and the workpiece contact each other when the cutting blade cuts the workpiece (see JP 2017-199777A). The measuring jig is mounted and used on the cutting unit.

SUMMARY OF THE INVENTION

While the measuring jig is in use, the position in which it is mounted on the cutting unit has to be changed each time items to be measured, i.e., pitching, yawing, etc., are changed. Since the operator manually changes the mounted position of the measuring jig, the changing process tends to make the measurement of the operation accuracy of the linear motion mechanisms time-consuming. Although the items to be measured include pitching, yawing, and rolling, the measuring jig cannot be used to measure rolling.

It is therefore an object of the present invention to provide a measuring jig, an operation accuracy measuring system, and an operation accuracy measuring method for measuring the operation accuracy of a linear motion mechanism in a short period of time with high accuracy.

In accordance with an aspect of the present invention, there is provided a measuring jig including a flat lower surface, a parallel surface opposite and parallel to the lower surface, and a slanted surface joined to the parallel surface through a straight boundary line and inclined to the parallel surface.

Preferably, a gradient of the slanted surface with respect to the parallel surface of the measuring jig ranges from $1/15000$ to $1/5000$.

In accordance with another aspect of the present invention, there is provided an operation accuracy measuring system for measuring the operation accuracy of a linear motion mechanism in an apparatus that includes a support table having a support surface for supporting an object thereon, a working unit for processing or measuring the object supported on the support table, and the linear motion mechanism that linearly moves the working unit and the support table relatively to each other along feed directions, the operation accuracy measuring system including a white light interferometer for observing a working spot on the support table where the working unit works on the object, the white light interferometer being connected to the working unit to be movable in a direction perpendicular to the feed directions, and a measuring jig having a flat lower surface, a parallel surface opposite and parallel to the lower surface, and a slanted surface joined to the parallel surface through a straight boundary line and inclined to the parallel surface, in which the measuring jig is placed on the support table or a table base for supporting the support table with the boundary line being oriented in a direction parallel to the feed directions and positioned at a position where the parallel surface and the slanted surface can simultaneously be observed in an observation zone of the white light interferometer, and while the linear motion mechanism is operated to linearly move the working unit and the measuring jig relatively to each other in one of the feed directions, the white light interferometer captures images of the parallel surface and the slanted surface of the measuring jig and observes changes in interference fringes appearing in image sections of the captured images that represent the parallel surface and the slanted surface, after which the operation accuracy of the linear motion mechanism is deduced on the basis of the observed changes in the interference fringes.

In the operation accuracy measuring system, preferably, the gradient of the slanted surface with respect to the parallel surface of the measuring jig ranges from $1/15000$ to $1/5000$.

In accordance with a further aspect of the present invention, there is provided an operation accuracy measuring method for measuring the operation accuracy of a linear motion mechanism in an apparatus that includes a support table having a support surface for supporting an object thereon, a working unit for processing or measuring the object supported on the support table, and the linear motion mechanism that linearly moves the working unit and the support table relatively to each other along feed directions, the operation accuracy measuring method including a placing step of placing a measuring jig on the support table or a table base for supporting the support table, the measuring jig having a flat lower surface, a parallel surface opposite and parallel to the lower surface, and a slanted surface joined to the parallel surface through a straight boundary line and inclined to the parallel surface, an adjusting step of adjusting orientation of the measuring jig to make the boundary line of the measuring jig parallel to the feed directions and adjusting positions of the measuring jig and a white light interferometer connected to the working unit to allow the white light interferometer to observe the parallel surface and the slanted surface simultaneously, an interference fringe observing step of, while the linear motion mechanism is operated to linearly move the working unit and the measuring jig relatively to each other in one of the feed directions, capturing images of the parallel surface and the slanted surface of the measuring jig with the white light interferometer and observing changes in interference fringes appearing in image sections of the captured images that represent the parallel surface and the slanted surface, and an operation accuracy deducing step of deducing the operation accuracy of the linear motion mechanism on the basis of the observed changes in the interference fringes.

In the operation accuracy measuring method, preferably, the operation accuracy deducing step includes deducing yawing accuracy as an element of the operation accuracy on the basis of a maximum change observed in a tilt angle of the interference fringes in the image section representing the slanted surface while the working unit and the measuring jig are being moved relatively to each other, deducing pitching accuracy as another element of the operation accuracy on the basis of a maximum change observed in brightness of the interference fringes in the image section representing the slanted surface while the working unit and the measuring jig are being moved relatively to each other, and deducing rolling accuracy as still another element of the operation accuracy by observing whether or not there are interference fringes appearing in the image section representing the parallel surface or by observing changes in intervals between the interference fringes in the image section representing the slanted surface while the working unit and the measuring jig are being moved relatively to each other.

In the operation accuracy measuring method, preferably, the gradient of the slanted surface with respect to the parallel surface of the measuring jig ranges from $\frac{1}{15000}$ to $\frac{1}{5000}$.

The measuring jig according to the aspect of the present invention, which is also used in the operation accuracy measuring system and the operation accuracy measuring method according to the other aspects of the present invention, includes the flat lower surface, the parallel surface opposite and parallel to the lower surface, and the slanted surface joined to the parallel surface through the straight boundary line and inclined to the parallel surface. For deducing the operation accuracy of the linear motion mechanism that linearly moves the support table and the working unit relatively to each other, the measuring unit is placed on the support table or a table base for supporting the support table. Then, the linear motion mechanism is operated while an upper surface, i.e., the parallel surface and the slanted surface, of the measuring jig is being observed with a white light interferometer that is connected to the working unit. The operation accuracy of the linear motion mechanism can be measured highly accurately on the basis of changes observed in interference fringes appearing in image sections of images captured by the white light interferometer. Different elements of the operation accuracy, e.g., yawing accuracy, pitching accuracy, and rolling accuracy, can be assessed on the basis of the changes in the interference fringes. When the measuring jig is in use, it does not need to be replaced on the support table each time the elements of the operation accuracy are to be changed. The different elements of the operation accuracy can be assessed simultaneously simply by operating the linear motion mechanism only once. In other words, the operation accuracy of the linear motion mechanism can be measured quickly by using the measuring jig in combination with the white light interferometer.

According to the aspects of the present invention, therefore, there are provided a measuring jig, an operation accuracy measuring system, and an operation accuracy measuring method for measuring the operation accuracy of a linear motion mechanism in a short period of time with high accuracy.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A measuring jig, an operation accuracy measuring system, and an operation accuracy measuring method for measuring the operation accuracy of a linear motion mechanism according to a preferred embodiment of the present invention will be described in detail hereinbelow with reference to the attached drawings. First, an apparatus with which to use the measuring jig according to the present embodiment, also referred to as a "target apparatus," will be described below. The target apparatus may be a processing apparatus for performing a predetermined processing operation on a workpiece, a measuring apparatus for measuring a property of a specimen according to a predetermined process, or the like. According to the present embodiment, a cutting apparatus for cutting a workpiece will be described by way of example below as the target apparatus. According to the present invention, however, the target apparatus is not limited to a cutting apparatus.

Figure 1:
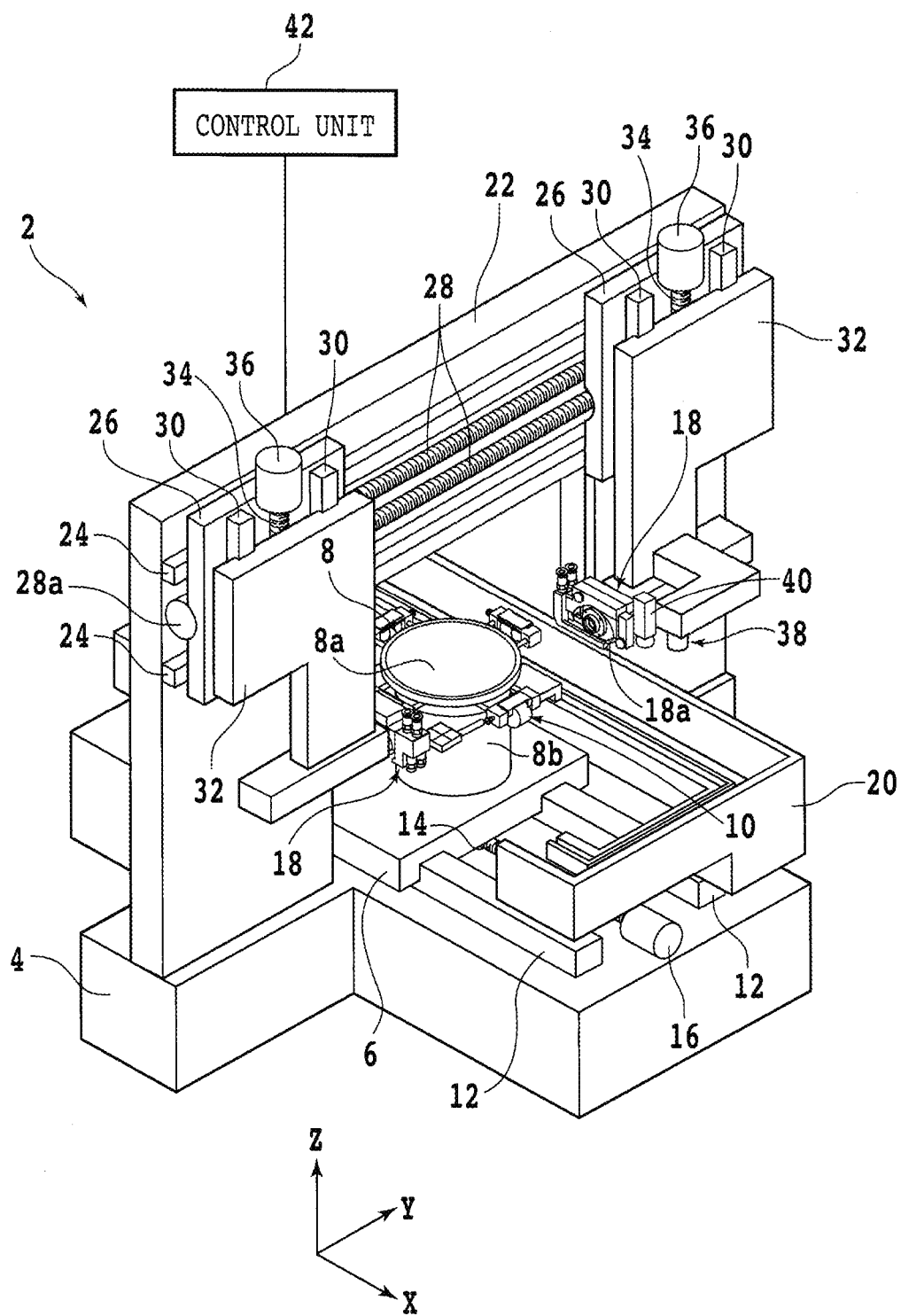
FIG. 1 is a perspective view schematically illustrating a cutting apparatus.

FIG. 1 illustrates in perspective a cutting apparatus 2, as the target apparatus, for cutting a workpiece such as a substrate shaped as a substantially circular plate made of a material such as silicon, silicon carbide (SiC), gallium arsenide (GaAs), or other semiconductors or a material such as sapphire, glass, or quartz. A plurality of devices such as integrated circuits (ICs) are formed in respective areas demarcated on the face side of the workpiece by a grid of projected dicing lines established thereon. The cutting apparatus 2 cuts the workpiece along the projected dicing lines, dividing the workpiece into individual device chips including the respective devices. The workpiece is cut by the cutting apparatus 2 while being affixed to a tape attached to an annular frame and positioned in the opening of the annular frame, for example.

In FIG. 1, the cutting apparatus 2 is illustrated in an XYZ orthogonal coordinate system having an X-axis, a Y-axis, and a Z-axis. The X-axis and the Y-axis extend horizontally perpendicularly to each other and the Z-axis extends vertically perpendicularly to the X-axis and the Y-axis. Directions along the X-axis, the Y-axis, and the Z-axis are referred to as X-axis directions, Y-axis directions, and Z-axis directions.

As illustrated in FIG. 1, the cutting apparatus 2 includes an apparatus base 4 that supports components of the cutting apparatus 2 thereon. The cutting apparatus 2 has an X-axis movable table 6, a processing feed mechanism for moving the X-axis movable table 6 in X-axis directions, i.e., processing feed directions, and a water draining channel 20 covering the processing feed mechanism, all mounted on the upper surface of a central portion of the apparatus base 4. The processing feed mechanism includes a pair of X-axis guide rails 12 extending parallel to the X-axis directions. The X-axis movable table 6 is slidably mounted on the X-axis guide rails 12. The X-axis movable table 6 has a nut, not illustrated, disposed on a lower surface thereof and operatively threaded over an X-axis ball screw 14 extending parallel to and disposed between the X-axis guide rails 12. The X-axis ball screw 14 has an end coupled to an X-axis stepping motor 16 mounted on the apparatus base 4. When the X-axis stepping motor 16 is energized, it rotates the X-axis ball screw 14 about its central axis, causing the nut to move the X-axis movable table 6 in one of the X-axis directions along the X-axis guide rails 12.

A table base 8b is disposed on the X-axis movable table 6, and a chuck table, i.e., a support table, 8 for attracting and holding a workpiece under suction thereon is disposed on an upper surface of the table base 8b. The chuck table 8 may alternatively be disposed directly on the X-axis movable table 6. The chuck table 8 or the table base 8b is coupled to a rotary actuator, not illustrated, such as an electric motor, so that the chuck table 8 or the table base 8b can be rotated about an axis perpendicular to an upper surface of the chuck table 8 by the rotary actuator. The chuck table 8 or the table base 8b is also movable in the X-axis directions by the processing feed mechanism referred to above. The chuck table 8 has an upper surface acting as a holding surface or a support surface for holding the workpiece under suction thereon. The holding surface 8a is connected to a suction source, not illustrated, through a fluid channel, not illustrated, defined in the chuck table 8. The holding surface 8a is surrounded by a plurality of clamps 10 for clamping in position an annular frame that supports the workpiece in its opening through a tape.

The cutting apparatus 2 further includes a support structure 22 mounted on the upper surfaces of end portions of the apparatus base 4 over and across the processing feed mechanism. The support structure 22 supports thereon two cutting units, i.e., working units, 18 for cutting the workpiece held on the holding surface 8a of the chuck table 8. The two cutting units 18 are movable in Y-axis directions, i.e., indexing feed directions, by an indexing feed mechanism, and in Z-axis directions, i.e., incising feed directions, by an incising feed mechanism. The indexing feed mechanism and the incising feed mechanism, to be described below, are mounted on the front surface, which faces in one of the X-axis directions, i.e., the direction indicated by the arrow X, of an upper portion of the support structure 22.

A pair of Y-axis guide rails 24 extending parallel to the Y-axis directions are mounted on the front surface of the upper portion of the support structure 22. Two Y-axis movable plates 26 that are combined respectively with the two cutting units 18 are slidably mounted on the Y-axis guide rails 24. The Y-axis movable plates 26 have respective nuts, not illustrated, disposed on respective reverse sides, i.e., rear surfaces, thereof, which face the front surface of the upper portion of the support structure 22, and operatively threaded over respective Y-axis ball screws 28 extending parallel to and disposed between the Y-axis guide rails 24. The Y-axis ball screws 28 have respective ends connected to Y-axis stepping motors 28a, one illustrated in FIG. 1. When the Y-axis stepping motors 28a are energized, they rotate the corresponding Y-axis ball screws 28 about their central axes, causing the nuts to move the Y-axis movable plates 26 in one of the Y-axis directions along the Y-axis guide rails 24. The Y-axis guide rails 24, the Y-axis movable plates 26, the Y-axis ball screws 28, and the Y-axis stepping motors 28a jointly make up the indexing feed mechanism.

A pair of Z-axis guide rails 30 extending parallel to the Z-axis directions are mounted on the face side, i.e., the front surface, of each of the Y-axis movable plates 26. A Z-axis movable plate 32 is slidably mounted on the Z-axis guide rails 30 on each of the Y-axis movable plates 26. The Z-axis movable plate 32 has a nut, not illustrated, disposed on a reverse side, i.e., a rear surface, thereof, which faces the front surface of the Y-axis movable plate 26, and operatively threaded over a Z-axis ball screw 34 extending parallel to and disposed between the Z-axis guide rails 30. The Z-axis ball screw 34 on each of the Y-axis movable plates 26 has an end connected to a Z-axis stepping motor 36. When the Z-axis stepping motor 36 is energized, it rotates the Z-axis ball screw 34 about its central axis, causing the nut to move the Z-axis movable plate 32 in one of the Z-axis directions along the Z-axis guide rails 30 on each of the Y-axis movable plates 26. The Z-axis guide rails 30, the Z-axis movable plates 32, the Z-axis ball screws 34, and the Z-axis stepping motors 36 jointly make up the incising feed mechanism.

The cutting units 18 for cutting the workpiece held on the chuck table 8 and image capturing units 38 for capturing an image of the workpiece held on the chuck table 8 are fixedly mounted on respective lower portions of the two Z-axis movable plates 32. When the Y-axis movable plates 26 are moved in the Y-axis directions, the cutting units 18 and the image capturing units 38 are also moved in the same Y-axis directions. When the Z-axis movable plates 32 are moved in the Z-axis directions, the cutting units 18 and the image capturing units 38 are also moved in the same Z-axis directions.

Figure 3:
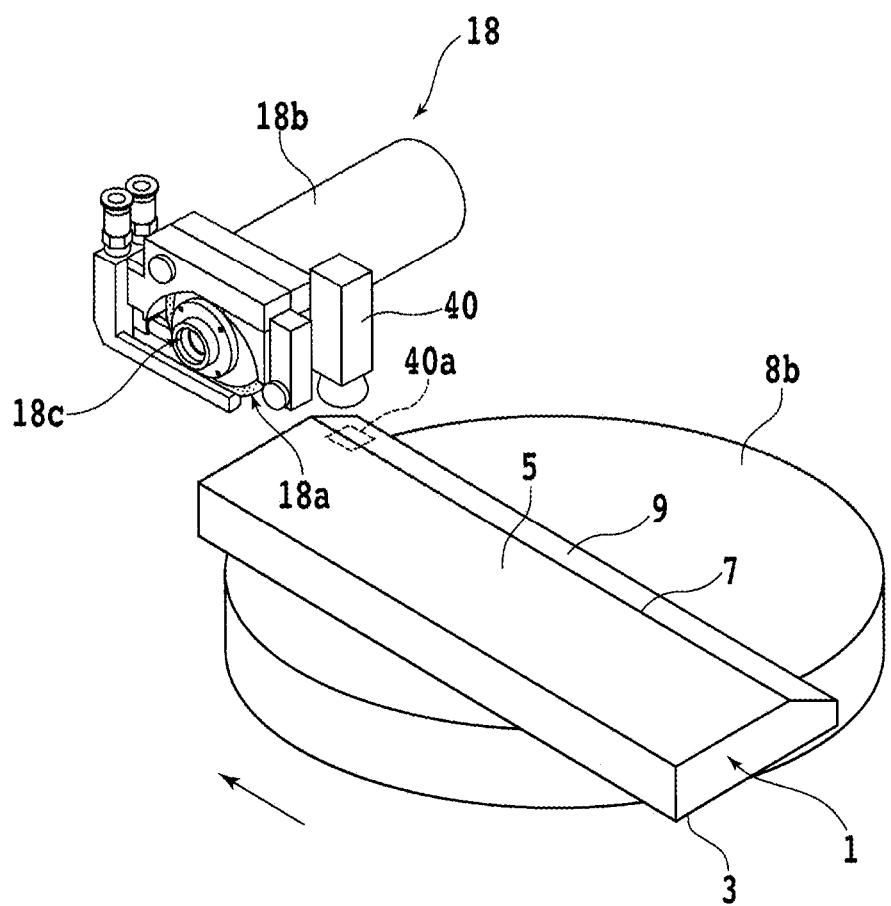
FIG. 3 is a perspective view schematically illustrating a cutting unit, i.e., a working unit, of the cutting apparatus and the measuring jig.

FIG. 3 schematically illustrates one of the cutting units 18 in perspective. Since the two cutting units 18 are identical in structure and operation, one of the cutting units 18 will be described below with reference to FIG. 3. The cutting unit 18 includes a spindle 18c extending along the Y-axis directions parallel to the holding surface 8a of the chuck table 8 and an annular cutting blade 18a mounted on the distal end of the spindle 18c. The other proximal end of the spindle 18c is rotatably housed in a spindle housing 18b and connected to a rotary actuator, not illustrated, such as an electric motor, also housed in the spindle housing 18b. Therefore, when the rotary actuator is energized, it rotates the spindle 18c about its central axis.

The cutting blade 18a has a disk-shaped base, for example. The base has a substantially circular through hole defined therein that extends therethrough. When the cutting blade 18a is mounted on the spindle 18c, the distal end of the spindle 18c extends through the through hole in the base. The cutting blade 18a also has an annular cutting edge on the outer circumferential portion of the base for cutting into the workpiece held on the chuck table 8. The cutting edge is also referred to as a "grindstone part." The cutting edge is made of abrasive grains of diamond or the like and a binder that holds together the abrasive grains dispersed therein. The binder is made of metal or resin, for example.

The cutting apparatus 2 will further be described below with reference to FIG. 1. For cutting the workpiece with the cutting apparatus 2, the image capturing units 38 capture an image of devices, patterns, or the like on the face side of the workpiece, and the position of one of the projected dicing lines on the face side of the workpiece is recognized on the basis of the captured image. Then, the chuck table 8 is rotated about its central axis to bring the projected dicing line whose position has been recognized into alignment with the processing feed directions of the cutting apparatus 2. Thereafter, the processing feed mechanism and the indexing feed mechanism are actuated to position the cutting blade 18a above an extension of the projected dicing line of the workpiece.

The spindle 18c is rotated to rotate the cutting blade 18a, and the height of the cutting unit 18 is adjusted to bring the lower end of the cutting edge of the cutting blade 18a to a vertical position lower than the reverse side, i.e., the lower surface, of the workpiece. Then, the incising feed mechanism is actuated to place the cutting unit 18 at a predetermined vertical position for cutting the workpiece. The processing feed mechanism is actuated to move the chuck table 8 in one of the processing feed directions, i.e., to processing-feed the chuck table 8, causing the cutting blade 18a to cut into the workpiece along the projected dicing line. After the workpiece has been cut along the projected dicing line, the indexing feed mechanism is actuated to indexing-feed the cutting unit 18 in one of the Y-axis directions until the cutting blade 18a is aligned with a next projected dicing line. Thereafter, the processing feed mechanism is actuated to processing-feed the chuck table 8, cutting the workpiece along the next projected dicing line. In this manner, the cutting apparatus 2 cuts the workpiece successively along all the projected dicing lines thereon.

The cutting apparatus 2 further includes a control unit 42. The control unit 42 has functions to control the components of the cutting apparatus 2 that include the cutting units 18, the chuck table 8, the moving mechanisms, the image capturing units 38, a white light interferometer 40, to be described later, etc. The functions of the control unit 42 are realized as software resources for a computer for controlling the cutting apparatus 2. In other words, the control unit 42 includes a computer including a processor such as a central processing unit (CPU) and a storage device such as a flash memory. When operated, the processor runs the software resources represented by programs stored in the storage device to perform the functions of the control unit 42. In other words, the control unit 42 functions as specific means implemented by the software resources in collaboration with the processor as a hardware resource.

As described above, the cutting apparatus 2 includes a plurality of linear motion mechanisms including the processing feed mechanism, the indexing feed mechanism, and the incising feed mechanism. Each of these linear motion mechanisms linearly move the chuck table 8 and the cutting units 18 relatively to each other along particular feed directions. The cutting apparatus 2 can cut or process the workpiece to a nicety when the linear motion mechanisms operate highly accurately.

Conversely, the cutting apparatus 2 is unable to perform a desired cutting process on the workpiece unless the linear motion mechanisms operate appropriately. For this reason, it is desirable to measure the operation accuracy of each of the linear motion mechanisms. As an assessment item for the operation accuracy of the linear motion mechanisms, operation of the processing feed mechanism, for example, will be described below. The processing feed mechanism has a function to move the chuck table 8 linearly in the X-axis directions, i.e., feed directions. In a case where the operation accuracy of the processing feed mechanism is problematic, the chuck table 8 may oscillate about an axis along the Z-axis directions that are perpendicular to the feed directions. This phenomenon is referred to as yawing. The chuck table 8 may also turn about an axis parallel to the Y-axis directions perpendicular to the feed directions. This phenomenon is referred to as pitching. The chuck table 8 may further rock about an axis parallel to the X-axis directions, i.e., the feed directions. This phenomenon is referred to as rolling.

For measuring the operation accuracy of a linear motion mechanism, it has been customary to use the measuring jig disclosed in JP 2017-199777A, for example. The disclosed measuring jig is capable of measuring the operation accuracy of the linear motion mechanism at a processing spot where a cutting blade, e.g., the cutting blade 18a, and a workpiece contact each other. The measuring jig is mounted and used on a cutting unit, e.g., the cutting unit 18. However, while the measuring jig is in use, the position in which it is mounted on the cutting unit 18 has to be changed each time items to be measured, i.e., pitching, yawing, etc., are changed. Since the operator manually changes the mounted position of the measuring jig, the changing process tends to make the measurement of the operation accuracy of the linear motion mechanism time-consuming. Moreover, the measuring jig cannot be used to measure rolling.

Figure 2:
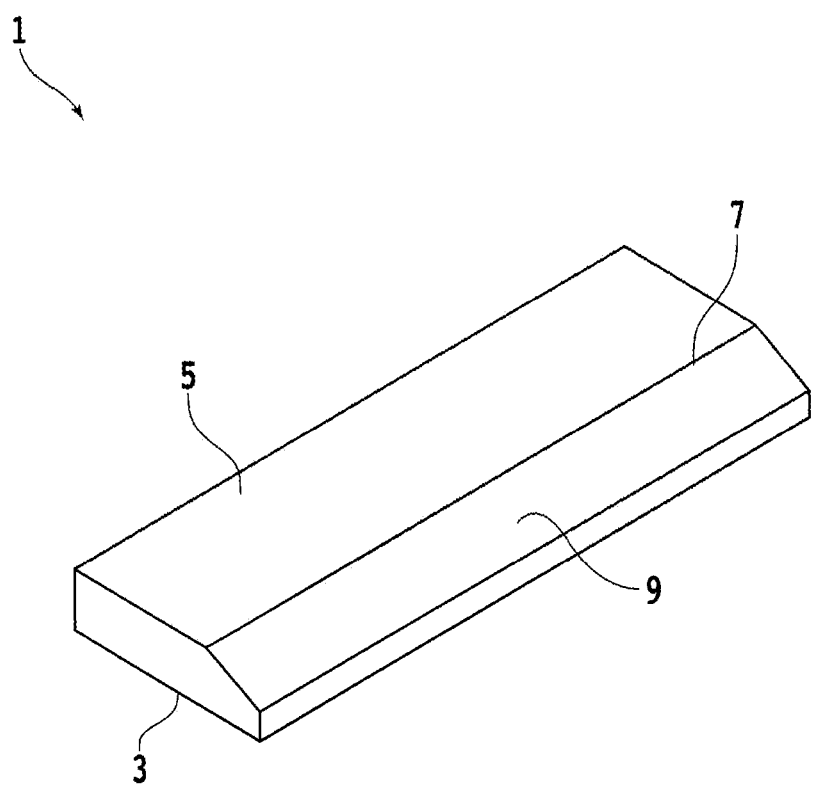
FIG. 2 is a perspective view schematically illustrating a measuring jig according to an embodiment of the present invention.

According to the present embodiment, a measuring jig 1 illustrated in FIG. 2 is used to measure the operation accuracy of a linear motion mechanism. FIG. 2 schematically illustrates the measuring jig 1 in perspective. The measuring jig 1 will be described in detail below. The measuring jig 1 is used in combination with a white light interferometer, to be described later, while being held in contact with the linear motion mechanism whose operation accuracy is to be measured with the chuck table 8 or the table base 8b interposed therebetween. The measuring jig 1 is made of a hard metal material such as stainless steel, for example. The measuring jig 1 has a flat lower surface 3 and an upper surface including a parallel surface 5 opposite and parallel to the lower surface 3 and a slanted surface 9 joined to the parallel surface 5 through a straight boundary line 7 and slightly inclined to the parallel surface 5. In FIG. 2 and other figures, the gradient of the slanted surface 9 of the measuring jig 1 with respect to the parallel surface 5 is exaggerated for illustrative purposes.

The gradient of the slanted surface 9 with respect to the parallel surface 5 should preferably be in the range from $\frac{1}{15000}$ to $\frac{1}{5000}$, more preferably in the range from $\frac{1}{12500}$ to $\frac{1}{7500}$, and particularly preferably in the range from $\frac{1}{11000}$ to $\frac{1}{9000}$. Most preferably, the gradient should be $\frac{1}{10000}$. The length of the measuring jig 1 along the boundary line 7 should preferably be larger than the length of a region of the chuck table 8 that could be the processing spot. In other words, the length of the measuring jig 1 along the boundary line 7 should preferably be larger than the diameter of the holding surface 8a. If the diameter of the holding surface 8a is 300 mm, for example, then the length of the measuring jig 1 should preferably be approximately 350 mm.

The height of the measuring jig 1, i.e., the thickness thereof between the lower surface 3 and the parallel surface 5, should preferably be equivalent to the height or thickness of the chuck table 8, e.g., should preferably be approximately 20 mm. As described later, the measuring jig 1 may be used on the table base 8b that supports the chuck table 8 thereon. If the thickness of the measuring jig 1 is equivalent to the thickness of the chuck table 8, then the measuring jig 1 as it is placed on the table base 8b has an upper surface whose height or vertical position is equivalent to the height or vertical position of the processing spot. The width of the measuring jig 1 that extends across the height and length thereof should preferably be approximately 80 mm. The boundary line 7 should preferably be positioned in the vicinity of the center of the measuring jig 1 in its widthwise directions. However, the various dimensions referred to above of the measuring jig 1 are not limited to the illustrated numerical values, and may be determined in such a range that sufficiently wide areas of the parallel surface 5 and the slanted surface 9 can be covered in an observation zone 40a (see FIG. 3) of the white light interferometer, denoted by 40.

It is most important in order for the measuring jig 1 to perform its function that each of the lower surface 3, the parallel surface 5, and the slanted surface 9 be highly flat, the lower surface 3 and the parallel surface 5 lie parallel to each other with high precision, and the gradient of the slanted surface 9 with respect to the parallel surface 5 fall in the above range. Nevertheless, there are certain instances where the measuring jig 1 can perform its function properly even if the parallel surface 5 does not lie parallel to the lower surface 3 with high precision. In some situations, the parallel surface 5 may not lie parallel to the lower surface 3 with high precision provided the gradient of the parallel surface 5 with respect to the lower surface 3 is smaller than the gradient of the slanted surface 9 with respect to the parallel surface 5, and the lower surface 3 and the parallel surface 5 may not lie parallel to each other. The function of the measuring jig 1 and the manner in which it is used will be described in detail later.

The white light interferometer 40 (see FIG. 3) to be used in combination with the measuring jig 1 will be described below. The white light interferometer 40 is connected to one of the cutting units 18 while in use. FIG. 3 schematically illustrates the white light interferometer 40 that is connected to the cutting unit 18. The white light interferometer 40 has a function to observe the measuring jig 1 that is placed on the chuck table 8. The white light interferometer 40 is connected to the cutting unit 18 with a lifting and lowering mechanism, not illustrated, operatively interposed therebetween. The white light interferometer 40 is movable along the Z-axis directions perpendicular to the feed directions with respect to the cutting unit 18 by the lifting and lowering mechanism. The lifting and lowering mechanism may preferably, but not necessarily, include a ball screw actuator. The white light interferometer 40 may be securely mounted on the cutting unit 18 at all times or may be removably mounted thereon. The distance of the white light interferometer 40 from the measuring jig 1 can be adjusted by the lifting and lowering mechanism to adjust the length of an optical path between the white light interferometer 40 and the measuring jig 1.

Figure 4:
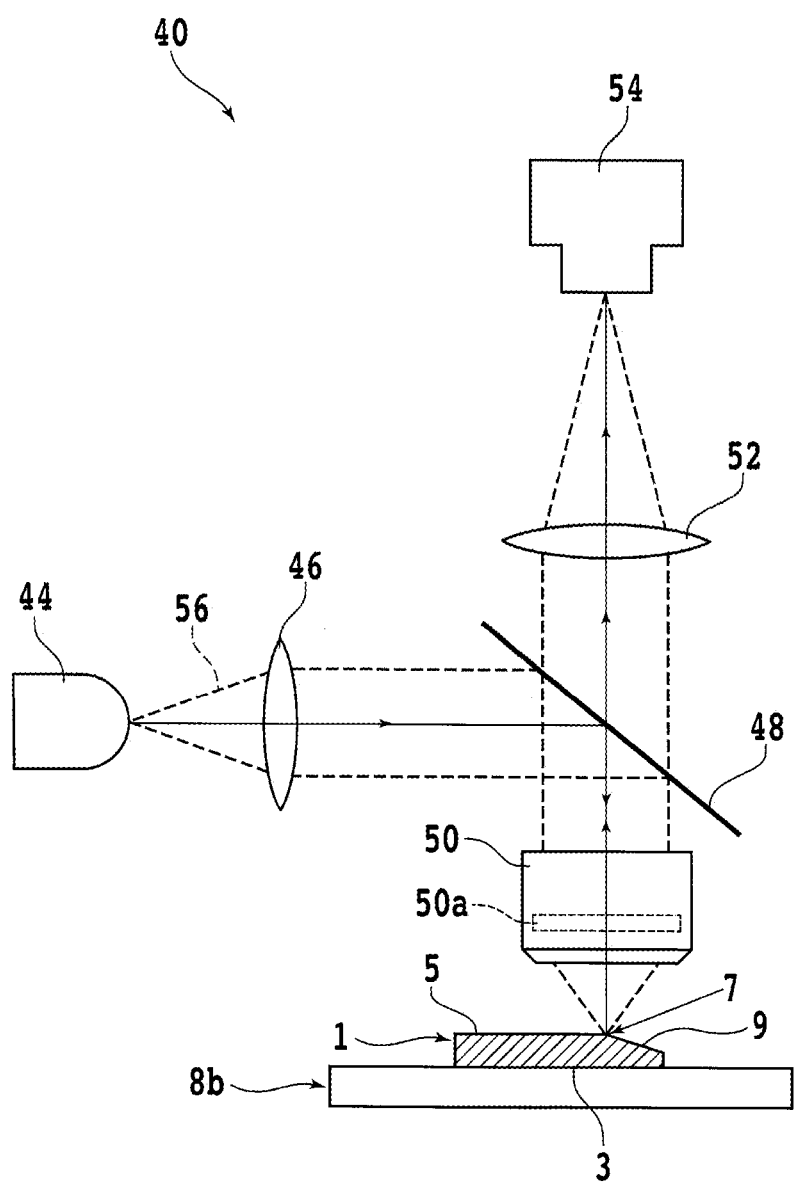
FIG. 4 is a side elevational view schematically illustrating the optical system of a white light interferometer.

Structural details of the white light interferometer 40 will be described below. FIG. 4 schematically illustrates in side elevation a simplest structural example of the optical system of the white light interferometer 40. The optical system of the white light interferometer 40 may be varied insofar as the white light interferometer 40 can perform its function properly. As illustrated in FIG. 4, the white light interferometer 40 includes a white light source 44, a first lens 46, a beam splitter 48, an interference objective lens 50, a second lens 52, and an array sensor 54. The white light source 44 includes a white light-emitting diode (LED), a halogen lamp, or the like. The white light source 44 has a function to emit white light whose intensity is dominant in the visible light range. White light 56 emitted from the white light source 44 reaches the first lens 46. The first lens 46 has a function to convert the white light 56 into parallel light. The white light 56 as converted into parallel light by the first lens 46 is reflected by the beam splitter 48 and travels toward the interference objective lens 50.

The interference objective lens 50 has a function to divide the white light 56 into two beams, reflect one of the beams back to the beam splitter 48, and apply the other beam to the measuring jig 1. The interference objective lens 50 incorporates therein, for example, a reference mirror 50a for reflecting one of the white light 56 back to the beam splitter 48. However, the interference objective lens 50 is not limited to the illustrated structure. The other beam of the white light 56 that is applied to the measuring jig 1 is reflected by the measuring jig 1 and travels back to the interference objective lens 50 and then to the beam splitter 48 along the same optical path shared by the beam of the white light 56 that is reflected by the reference mirror 50a. The white light 56 where the beams reflected respectively by the reference mirror 50a and the measuring jig 1 are combined with each other is transmitted through the beam splitter 48 and focused onto the array sensor 54 by the second lens 52. The array sensor 54 includes a photodetector such as a complementary metal oxide semiconductor (CMOS) sensor or a charge-coupled device (CCD) sensor, and captures an image of the white light 56 falling thereon.

The image that is captured of the white light 56 by the array sensor 54 represents interference fringes, i.e., a spatial interference pattern, reflecting the difference between the optical paths followed by the two beams of the white light 56 that are divided and then combined. Specifically, the spatial interference pattern includes bright fringes where the two beams of the white light 56 are in phase with each other and dark fringes where the two beams of the white light 56 are 180° out of phase with each other. Consequently, the interference fringes obtained by the array sensor 54 represent information regarding the height distribution of the observed surface of the measuring jig 1 that is irradiated with the white light 56. The white light 56 includes low-coherence light whose intensity is in a broad wavelength range and that has a very short coherence length. Therefore, the interference fringes observed by the array sensor 54 do not represent other elements than the observed surface of the measuring jig 1 that is positioned in the vicinity of the height of the focus, and provide a low-noise, high vertical resolution.

Figure 5A:
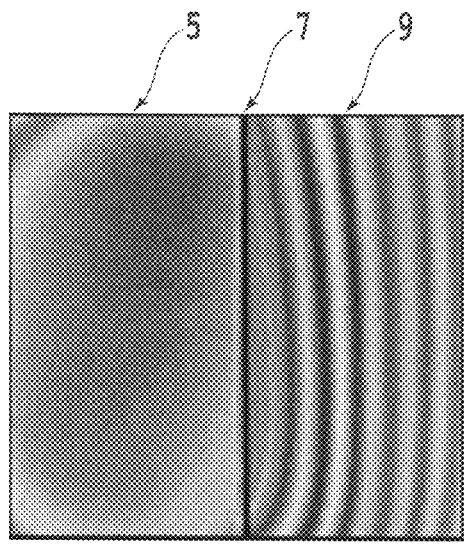
FIG. 5A is a diagram illustrating a photographic representation produced by assuming an example of interference fringes.

FIG. 5A illustrates a photographic representation 56a produced by assuming an example of interference fringes to be obtained by observing an area of the measuring jig 1 near the boundary line 7 with the white light interferometer 40. The photographic representation 56a does not represent an image obtained by actually observing the measuring jig 1 with the white light interferometer 40, but an observation image produced for explanatory purposes. Accordingly, the photographic representation 56a should not be construed as anything for purposes other than explanatory purposes, and has no other meanings.

The photographic representation 56a has a left half section that is generally uniform in brightness and a right half section where a plurality of vertical stripes spaced at constant intervals are observed. These sections indicate that the upper surface of the measuring jig 1 is of a uniform height with respect to the white light interferometer 40 in the left half of the observation zone 40a of the white light interferometer 40 and is inclined at a constant gradient in the right half of the observation zone 40a of the white light interferometer 40. Specifically, the left half of the observation zone 40a represents the parallel surface 5, and the right half of the observation zone 40a represents the slanted surface 9, with the boundary line 7 interposed therebetween. The intervals and number of the vertical stripes that are developed on the basis of the slanted surface 9 are determined depending on the magnitude of the gradient of the slanted surface 9. If the gradient of the slanted surface 9 is too small, then the number of the stripes that appear in the captured image is reduced, making it difficult to detect changes in the interference fringes, as described later. On the other hand, if the gradient of the slanted surface 9 is too large, then the intervals between the stripes are too small, making it difficult to distinguish between adjacent two of the interference fringes. It is thus preferable to keep the gradient of the slanted surface 9 in the ranges described above.

Figure 6:
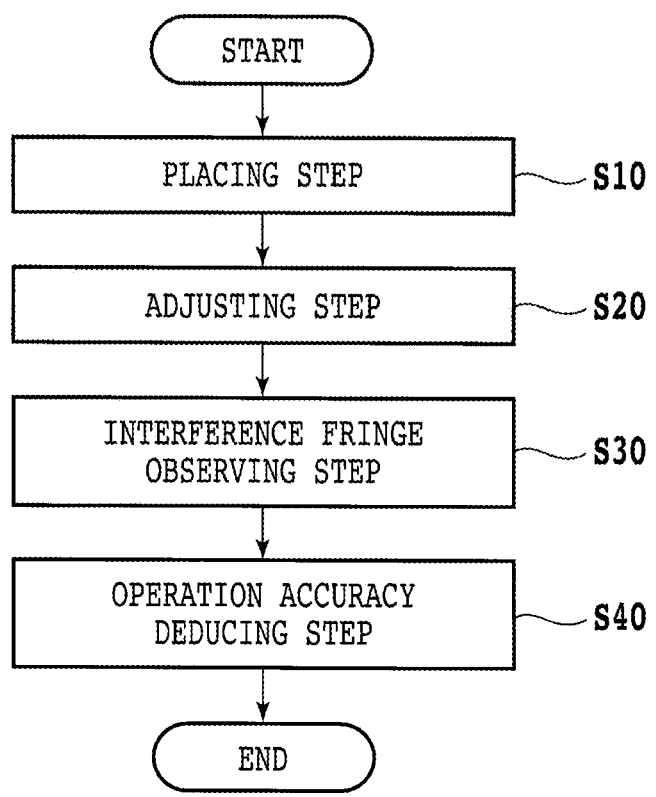
FIG. 6 is a flowchart of a sequence of steps of an operation accuracy measuring method for measuring the operation accuracy of a linear motion mechanism according to the embodiment of the present invention.

The measuring jig 1 and the white light interferometer 40 are basically used as follows. The measuring jig 1 is placed on the chuck table 8 or the table base 8b that can support the chuck table 8 thereon. Then, while the upper surface of the measuring jig 1 is being observed using the white light interferometer 40, the processing feed mechanism, i.e., a linear motion mechanism, is actuated. The operation accuracy of the processing feed mechanism is deduced from changes in interference fringes captured by the white light interferometer 40. Next, a method of measuring the operation accuracy of a linear motion mechanism using the measuring jig 1 and the white light interferometer 40 will be described below. FIG. 6 is a flowchart of a sequence of steps of the method of measuring the operation accuracy of a linear motion mechanism, also referred to as an "operation accuracy measuring method."

According to the operation accuracy measuring method, placing step S10 is first carried out to place the measuring jig 1 on the chuck table 8 or the table base 8b. More specifically, in placing step S10, the lower surface 3 of the measuring jig 1 is directed to face the holding surface 8a of the chuck table 8, and brought into contact with the chuck table 8, with the upper surface, i.e., the parallel surface 5 and the slanted surface 9, of the measuring jig 1 being exposed upwardly. Alternatively, in placing step S10, the lower surface 3 of the measuring jig 1 is directed to face the upper surface of the table base 8b from which the chuck table 8 has been removed, and brought into contact with the chuck table 8, with the upper surface of the measuring jig 1 being exposed upwardly. It is assumed hereinafter that the measuring jig 1 is placed on the table base 8b from which the chuck table 8 has been removed.

Then, adjusting step S20 is carried out to adjust the orientation and position of the measuring jig 1 and the position of the white light interferometer 40. FIG. 3 schematically illustrates the measuring jig 1 whose orientation and position have been adjusted on the table base 8b. In adjusting step S20, the orientation of the measuring jig 1 is adjusted to make the boundary line 7 of the measuring jig 1 parallel to the feed directions, i.e., the processing feed directions or the X-axis directions. In other words, the directions in which a component, i.e., the table base 8b, is linearly moved by the linear motion mechanism whose operation accuracy is to be measured and the directions in which the boundary line 7 of the measuring jig 1 extend are brought into alignment with each other. Then, in adjusting step S20, the positions of the measuring jig 1 and the white light interferometer 40 are adjusted to allow the white light interferometer 40 that is connected to the cutting unit 18 to observe the parallel surface 5 and the slanted surface 9 of the measuring jig 1 at the same time. In particular, as illustrated in FIG. 3, it is preferable to position the observation zone 40a of the white light interferometer 40 in the vicinity of an end of the boundary line 7.

For example, while keeping the measuring jig 1 oriented as described above, the operator manually adjusts the position of the measuring jig 1 on the table base 8b so as to cause the boundary line 7 to enter the observation zone 40a of the white light interferometer 40. Alternatively, while observing the upper surface of the measuring jig 1 with the white light interferometer 40, the operator operates the processing feed mechanism and the indexing feed mechanism to adjust the positions of the cutting unit 18 and the measuring jig 1 so as to bring the boundary line 7 into the observation zone 40a.

After adjusting step S20, the operator observes the upper surface of the measuring jig 1 in an image captured by the white light interferometer 40 while adjusting the height of the white light interferometer 40. At this time, if the operator observes interference fringes as indicated by the photographic representation 56a illustrated in FIG. 5A on the white light interferometer 40, then the operator can confirm that the white light interferometer 40 has been oriented properly. Specifically, if the area of the captured image that corresponds to the parallel surface 5 is free of interference fringes and generally uniform in brightness and the area of the captured image that corresponds to the slanted surface 9 includes a plurality of vertical stripes parallel to the boundary line 7, then the operator can confirm that the white light interferometer 40 has no problem with respect to its orientation. Conversely, if the operator fails to observe interference fringes as indicated by the photographic representation 56a in the captured image from the white light interferometer 40, then the operator needs to confirm the connection of the white light interferometer 40 to the cutting unit 18 and adjust the orientation of the white light interferometer 40. For example, the white light interferometer 40 may be connected to the cutting unit 18 through a biaxial goniometer stage for orientational adjustment, and the operator may adjust the orientation of the white light interferometer 40 using the biaxial goniometer stage.

After it has been confirmed that the white light interferometer 40 is oriented properly, interference fringe observing step S30 is carried out to observe changes in the interference fringes appearing in the captured image from the white light interferometer 40. In interference fringe observing step S30, the operator observes the parallel surface 5 and the slanted surface 9 in the captured image from the white light interferometer 40 while linearly moving the cutting unit 18 and the measuring jig 1 relatively to each other in one of the X-axis directions, i.e., the feed directions, with the processing feed mechanism, i.e., the linear motion mechanism, thereby observing changes in the interference fringes. At this time, the control unit 42 may control the processing feed mechanism to stop the cutting unit 18 and the measuring jig 1 from moving temporarily each time the operator observes the upper surface of the measuring jig 1 with the while light interferometer 40. This allows the operator to observe interference fringes with precision at each of various sites on the upper surface of the measuring jig 1. Alternatively, during interference fringe observing step S30, the operator may periodically operate the white light interferometer 40 to observe the upper surface of the measuring jig 1 without stopping the processing feed mechanism. In the latter case, the period of time required to observe interference fringes can be shortened. The white light interferometer 40 is electrically connected to the control unit 42 of the cutting apparatus 2 and transmits a captured image representing observed interference fringes to the control unit 42. The control unit 42 assesses the observed interference images represented by the captured image transmitted from the white light interferometer 40, accumulates the assessed results, and generates information regarding changes in interference fringes.

Interference fringe observing step S30 is followed by operation accuracy deducing step S40 to deduce the operation accuracy of the processing feed mechanism, i.e., the linear motion mechanism, from the changes in the observed interference fringes. A process of deducing the operation accuracy of the processing feed mechanism will be described below. In operation accuracy deducing step S40, different elements, i.e., yawing accuracy, pitching accuracy, and rolling accuracy, of the operation accuracy of the processing feed mechanism are deduced.

Figure 5B:
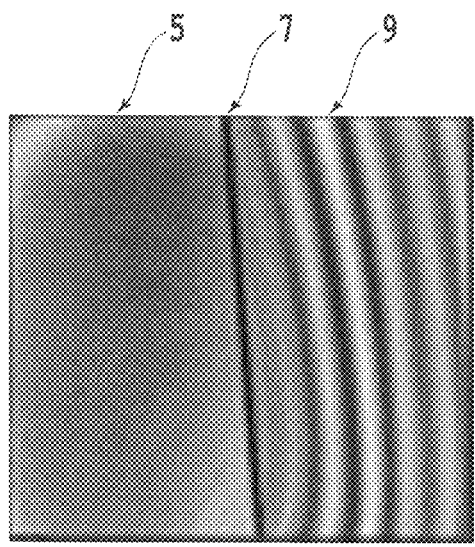
FIG. 5B is a diagram illustrating a photographic representation produced by assuming another example of interference fringes.

If the yawing accuracy of the processing feed mechanism is low, the table base 8b tends to oscillate about the axis along the Z-axis directions perpendicular to the feed directions while the cutting unit 18 and the table base 8b are being moved relatively to each other in one of the X-axis directions, i.e., the feed directions. In interference fringe observing step S30, therefore, the image captured of the upper surface of the measuring jig 1 by the white light interferometer 40 changes. FIG. 5B illustrates a photographic representation 56b produced by assuming an example of interference fringes, i.e., a spatial interference pattern, to be obtained by observing an area of the measuring jig 1 near the boundary line 7 with the white light interferometer 40 while the processing feed mechanism is yawing. As with the photographic representation 56a, the photographic representation 56b does not represent an image obtained by actually observing the measuring jig 1 with the white light interferometer 40, but an observation image produced for explanatory purposes.

When yawing occurs, the captured image including the interference fringes in the photographic representation 56b is tilted as a whole. More specifically, the boundary line 7 of the measuring jig 1 and the interference fringes that appear in the image section representing the slanted surface 9 are tilted through the same angle from the X-axis directions. The magnitude of the angle corresponds to a reduction in the yawing accuracy. While the cutting unit 18 and the measuring jig 1 are being linearly moved relatively to each other, the white light interferometer 40 captures images of the upper surface of the measuring jig 1 from one end to the other of the boundary line 7, and the angle through which the interference fringes that appear in the image section representing the slanted surface 9 are tilted is measured from each of the captured images. Therefore, the tendency of the yawing can be assessed from the tendency of changes in the angle of tilt, and the yawing accuracy representing part of the operation accuracy of the processing feed mechanism can be deduced from a maximum change in the angle of tilt, for example. For example, if any changes in the angle through which the interference fringes that appear in the image section representing the slanted surface 9 are tilted are sufficiently small, so that the boundary line 7, etc., extend basically along the X-axis directions all the time in the captured images, then the yawing accuracy can be determined to be good.

If the pitching accuracy of the processing feed mechanism is low, the table base 8b tends to oscillate about the axis along the Y-axis directions perpendicular to the feed directions while the cutting unit 18 and the table base 8b are being moved relatively to each other in one of the X-axis directions, i.e., the feed directions. At this time, the image captured of the upper surface of the measuring jig 1 by the white light interferometer 40 changes.

Figure 5C:
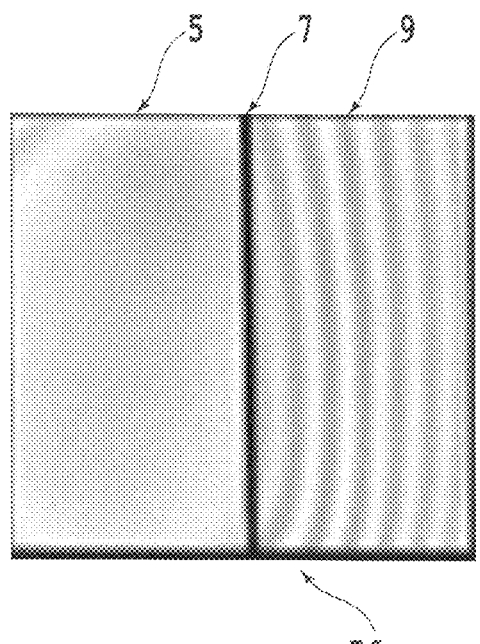
FIG. 5C is a diagram illustrating a photographic representation produced by assuming still another example of interference fringes.

FIG. 5C illustrates a photographic representation 56c produced by assuming an example of interference fringes, i.e., a spatial interference pattern, to be obtained by observing an area of the measuring jig 1 near the boundary line 7 with the white light interferometer 40 while the processing feed mechanism is pitching. As with the photographic representation 56a, the photographic representation 56c does not represent an image obtained by actually observing the measuring jig 1 with the white light interferometer 40, but an observation image produced for explanatory purposes. When pitching occurs, the distance between the upper surface of the measuring jig 1 and the white light interferometer 40 changes, resulting in phenomena including defocusing of captured images including interference fringes, changing of the brightness of interference fringes, movement of interference fringes along the Y-axis directions, etc. The degree to which the captured images are defocused, the degree to which the brightness of interference fringes changes, and the distance by which interference fringes move along the Y-axis directions correspond to a reduction in the pitching accuracy. While the cutting unit 18 and the measuring jig 1 are being linearly moved relatively to each other, changes in the brightness of interference fringes are measured.

Therefore, the tendency of the pitching can be assessed from the tendency of changes in the brightness of interference fringes, and the pitching accuracy representing part of the operation accuracy of the processing feed mechanism can be deduced from a maximum change in the brightness of interference fringes, for example. For example, if any changes in the brightness of interference fringes are sufficiently small and the brightness of interference fringes remains basically constant in the captured images, then the pitching accuracy can be determined to be good. In a case where the tendency of pitching is assessed from defocusing of a captured image, the operator stops operating the processing feed mechanism and lifts or lowers the white light interferometer 40. At this time, the operator can assess the degree of pitching from the distance that the white light interferometer 40 is lifted or lowered until the captured image is focused again. The chuck table 8 is moved and the white light interferometer 40 is lifted or lowered repeatedly to access the tendency of pitching, and the pitching accuracy is deduced from the difference between the highest vertical position of the white light interferometer 40 and the lowest vertical position of the white light interferometer 40.

Figure 5D:
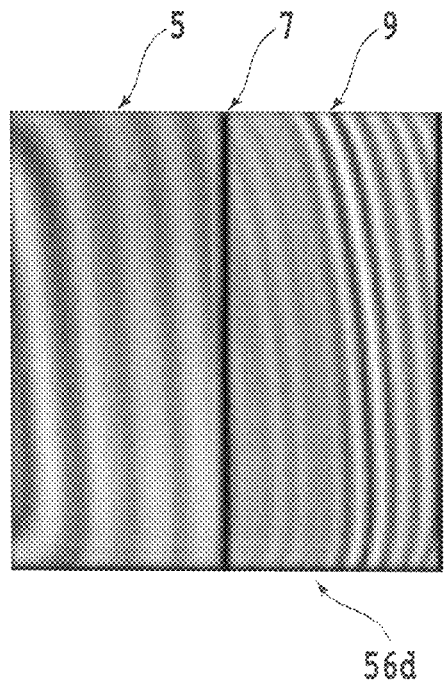
FIG. 5D is a diagram illustrating a photographic representation produced by assuming yet still another example of interference fringes.

If the rolling accuracy of the processing feed mechanism is low, the table base 8b tends to oscillate about the axis along the X-axis directions while the cutting unit 18 and the table base 8b are being moved relatively to each other in one of the X-axis directions, i.e., the feed directions. At this time, the image captured of the upper surface of the measuring jig 1 by the white light interferometer 40 changes. FIG. 5D illustrates a photographic representation 56d produced by assuming an example of interference fringes, i.e., a spatial interference pattern, to be obtained by observing an area of the measuring jig 1 near the boundary line 7 with the white light interferometer 40 while the processing feed mechanism is rolling. As with the photographic representation 56a, the photographic representation 56d does not represent an image obtained by actually observing the measuring jig 1 with the white light interferometer 40, but an observation image produced for explanatory purposes.

When rolling occurs, the parallel surface 5 of the measuring jig 1 is tilted, making various areas of the parallel surface 5 ununiform in height, so that interference fringes appear in the image section representing the parallel surface 5. Since the heights of the various areas of the slanted surface 9 are also changed, the intervals between the interference fringes in the image section representing the slanted surface 9 are changed depending on the magnitude of rolling. Consequently, the tendency of rolling can be assessed by observing whether or not there are interference fringes appearing in the image section representing the parallel surface 5 or by observing changes in the intervals between the interference fringes in the image section representing the slanted surface 9 while the cutting unit 18 and the measuring jig 1 are being moved relatively to each other. The rolling accuracy representing part of the operation accuracy of the processing feed mechanism can be deduced from a maximum change in the intervals between the interference fringes, for example. For example, if any changes in the intervals between the interference fringes in the image section representing the slanted surface 9 are sufficiently small and no interference fringes basically appear in the image section representing the parallel surface 5, then the rolling accuracy can be determined to be good.

Providing the operator has confirmed that the operation accuracy of the processing feed mechanism as deduced using the measuring jig 1 and the white light interferometer 40 does not meet a predetermined accuracy level, the operator services or replaces the processing feed mechanism. Thereafter, the operator deduces again the operation accuracy of the processing feed mechanism in the same manner as described above. Providing the operator has confirmed that the operation accuracy of the processing feed mechanism as deduced using the measuring jig 1 and the white light interferometer 40 meets the predetermined accuracy level, the operator can confirm that one of the conditions for properly processing a workpiece with the cutting apparatus 2 has been satisfied. The operation accuracy of each of the linear motion mechanisms of the cutting apparatus 2 may be deduced when the cutting apparatus 2 is installed in a factory or the like. Additionally or alternatively, the operation accuracy of each of the linear motion mechanisms of the cutting apparatus 2 may be deduced when the cutting apparatus 2 has been in operation over a predetermined period of time. In this manner, the cutting apparatus 2 is kept in a state of being capable of processing workpieces to a nicety. Since the measuring jig 1 according to the present embodiment is conducive to a quick deducibility of the operation accuracy of each of the linear motion mechanisms, it ensures the cutting apparatus 2 more uptime.

Inasmuch as the measuring jig 1 has the parallel surface 5 parallel to the lower surface 3 and the slanted surface 9 slightly inclined to the parallel surface 5, the measuring jig 1 allows the operation accuracy of the linear motion mechanisms to be deduced highly accurately in combination with the white light interferometer 40. When the measuring jig 1 is in use, it does not need to be replaced each time an element of the operation accuracy is to be deduced. In other words, the operation accuracy can be deduced in terms of different elements in a short period of time with high accuracy simply by operating each linear motion mechanism only once.

The processing feed mechanism of the cutting apparatus 2 has been described as the linear motion mechanism whose operation accuracy is to be deduced, and the operation accuracy of the linear motion mechanism has been described as being deduced using the measuring jig 1 and the white light interferometer 40. However, the principles of the present invention are also applicable to measuring the operation accuracy of other linear motion mechanisms. For example, the operation accuracy of the indexing feed mechanism may be deduced similarly using the measuring jig 1 and the white light interferometer 40.

Moreover, the operation accuracy of the incising feed mechanism may be deduced similarly using the measuring jig 1 and the white light interferometer 40. The incising feed mechanism is a linear motion mechanism for lifting and lowering the cutting unit 18 with respect to the chuck table 8. In order to use the measuring jig 1 and the white light interferometer 40 on the incising feed mechanism, the measuring jig 1 is securely put in an upstanding posture on the holding surface 8a of the chuck table 8 or the upper surface of the table base 8b. At this time, the upper surface of the measuring jig 1 is oriented to face the cutting unit 18 in one of the Y-axis directions. Then, the white light interferometer 40 is securely mounted on the cutting unit 18 so as to face the measuring jig 1. Thereafter, the incising feed mechanism is operated to lift and lower the cutting unit 18 while at the same time the white light interferometer 40 captures images of the upper surface, i.e., the parallel surface 5 and the slanted surface 9, of the measuring jig 1 along the boundary line 7. The operation accuracy of the indexing feed mechanism can then be deduced from changes in interference fringes that appear in the captured images.

In the illustrated embodiment, the measuring jig 1 is placed on the table base 8b or the chuck table 8, and the white light interferometer 40 is connected to the cutting unit 18. However, the measuring jig 1 and the white light interferometer 40 may be switched around. Specifically, the measuring jig 1 may be connected to the cutting unit 18, and the white light interferometer 40 may be placed on the table base 8b or the chuck table 8, so that the white light interferometer 40 can capture images of the measuring jig 1 on the cutting unit 18. According to the present invention, it is important that the measuring jig 1 be held in contact with one of two components that are moved and not moved respectively by a linear motion mechanism and the white light interferometer 40 be held in contact with the other of the two components.

In the illustrated embodiment, furthermore, the operation accuracy of a linear motion mechanism, e.g., the processing feed unit, of the cutting apparatus 2 including the cutting unit 18, is deduced using the measuring jig 1 and the white light interferometer 40. According to the present invention, however, the measuring jig 1 and the white light interferometer 40 may be used in other applications. For example, the measuring jig 1 and the white light interferometer 40 may be used in an inspecting apparatus for inspecting a specimen supported on a movable table with a microscope as it scans the specimen. Specifically, the measuring jig 1 and the white light interferometer 40 may be used to deduce the operation accuracy of a linear motion mechanism that linearly moves the movable table and the microscope relatively to each other. Moreover, the measuring jig 1 and the white light interferometer 40 may be used to deduce the operation accuracy of a linear motion mechanism in all kinds of apparatus that incorporate the linear motion mechanism for linearly moving a support table and a working unit relatively to each other. The measuring jig 1 and the white light interferometer 40 do not need to be dedicated to particular apparatus, and may be used as part of an independent system for measuring the operation accuracy of a linear motion mechanism. In other words, the measuring jig 1 according to the present invention and the white light interferometer 40 may make up an operation accuracy measuring system.

The operation accuracy measuring system measures the operation accuracy of a linear motion mechanism in an apparatus that includes a support table having a support surface for supporting an object thereon, a working unit for processing or measuring the object supported on the support table, and the linear motion mechanism that linearly moves the working unit and the support table relatively to each other along feed directions. The operation accuracy measuring system includes the measuring jig 1 and the white light interferometer 40.

The white light interferometer 40 is capable of observing a working spot on the support table where the working unit works on the object, and is connected to the working unit to be movable in a direction perpendicular to the feed directions. The measuring jig 1 has the flat lower surface 3 and the upper surface including the parallel surface 5 opposite and parallel to the lower surface 3 and the slanted surface 9 joined to the parallel surface 5 through the straight boundary line 7 and slightly inclined to the parallel surface 5, as described above. The measuring jig 1 with the boundary line 7 being oriented in a direction parallel to the feed directions is placed on the support surface at a position where the parallel surface 5 and the slanted surface 9 can simultaneously be observed in the observation zone 40*a* of the white light interferometer 40. Then, while the linear motion mechanism is operated to linearly move the working unit and the support table relatively to each other in one of the feed directions, the white light interferometer 40 captures images of the upper surface of the measuring jig 1 and observes changes in interference fringes appearing in image sections of the captured images that represent the parallel surface 5 and the slanted surface 9. Thereafter, the operation accuracy of the linear motion mechanism is deduced on the basis of the observed changes in the interference fringes.

In the above embodiment, the white light interferometer 40 irradiates the measuring jig 1 with white light whose intensity is dominant in a wide wavelength range for observing the interference fringes. According to the present invention, however, the white light interferometer 40 may irradiate the measuring jig 1 with light other than white light. For example, the heights of various sites on the parallel surface 5 and the slanted surface 9, i.e., the gradients of the parallel surface 5 and the slanted surface 9, may be detected by a phase-crossing process using monochromatic light. In the above embodiment, the white light interferometer 40 is used to observe interference fringes. However, the present invention is not limited to use of the white light interferometer 40. Instead of the white light interferometer 40, a laser interferometer may be used to observe interference fringes.

In the above embodiment, in a case where interference fringes appear not only in the image section representing the slanted surface 9 but also in the image section representing the parallel surface 5 when the upper surface of the measuring jig 1 placed on the table base 8*b* is observed with the white light interferometer 40, the orientation of the white light interferometer 40 is adjusted. However, the orientation of the white light interferometer 40 may not necessarily be adjusted in such a case. An important factor involved in deducing the operation accuracy of a linear motion mechanism is changes in interference fringes observed with the white light interferometer 40 while the linear motion mechanism is in operation. Even if the orientation of the white light interferometer 40 is not initially adjusted, the operation accuracy of the linear motion mechanism can properly be deduced providing changes in interference fringes observed while the linear motion mechanism is in operation can appropriately be detected. For example, it can be determined that the operation accuracy of the linear motion mechanism is high as long as the interference fringes observed in the image section representing the parallel surface 5 remain unchanged while the linear motion mechanism is in operation.

In the above embodiment, furthermore, the lower surface 3 and the parallel surface 5 of the measuring jig 1 lie parallel to each other with high precision. However, the parallel surface 5 may be inclined to the lower surface 3. When the upper surface of the measuring jig 1 with the parallel surface 5 inclined to the lower surface 3 is observed with the white light interferometer 40, the image section representing the parallel surface 5 is not uniform in brightness, and interference fringes appear not only in the image section representing the slanted surface 9 but also in the image section representing the parallel surface 5. However, the operation accuracy of the linear motion mechanism can be deduced on the basis of changes in the interference fringes in the image section representing the parallel surface 5 while the linear motion mechanism is in motion. Consequently, the parallel surface 5 may not lie parallel to the lower surface with high precision.

In the above embodiment, the measuring jig 1 is placed and used on the table base 8*b* from which the chuck table 8 has been removed. According to the present invention, however, the measuring jig 1 may be placed and used on the chuck table 8. In an apparatus that is free of the table base 8*b* and that has the chuck table 8 directly connected to a linear motion mechanism, the chuck table 8 may not easily be removed from the linear motion mechanism. In such an apparatus, the measuring jig 1 is placed and used on the holding surface 8*a* of the chuck table 8. In an apparatus that includes the table base 8*b*, the measuring jig 1 may also be placed and used on the holding surface 8*a* of the chuck table 8. In such an apparatus, the measuring jig 1 may be used without removing the chuck table 8 from the table base 8*b*. In addition, after the operation accuracy of the linear motion mechanism has been deduced, the apparatus can immediately be put to use simply by removing the measuring jig 1 from the chuck table 8. Consequently, the operation accuracy of the linear motion mechanism can be measured highly efficiently, and the operation efficiency of the apparatus is increased.

Although the chuck table 8 is fabricated so as to keep the holding surface 8a and a lower surface thereof lying parallel to each other, the accuracy of inclination of the holding surface 8a and the lower surface and the thickness distribution of the chuck table 8 tend to suffer certain variations. Therefore, when the measuring jig 1 is placed on the holding surface 8a of the chuck table 8, the upper surface of the measuring jig 1 may be tilted due to configurational irregularities of the chuck table 8. In a case where the measuring jig 1 is placed and used on the table base 8b as described above in the above embodiment, the operation accuracy of the linear motion mechanism can be deduced regardless of configurational irregularities of the chuck table 8.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A measuring jig comprising:
   a flat lower surface;
   a parallel surface opposite and parallel to the lower surface; and
   a slanted surface joined to the parallel surface through a straight boundary line and inclined to the parallel surface,
   wherein a gradient of the slanted surface with respect to the parallel surface of the measuring jig ranges from $1/15000$ to $1/5000$, and
   wherein the measuring jig is configured to be disposed on a holding surface of a chuck table, and wherein a length of the measuring jig along the boundary line is larger than a diameter of the holding surface.

2. An operation accuracy measuring system for measuring operation accuracy of a linear motion mechanism in an apparatus that includes a support table having a support surface for supporting an object thereon, a working unit for processing the object supported on the support table, and the linear motion mechanism that linearly moves the working unit and the support table relatively to each other along feed directions, the operation accuracy measuring system comprising:
   a white light interferometer for observing a working spot on the support table where the working unit works on the object, the white light interferometer being connected to the working unit to be movable in a direction perpendicular to the feed directions; and
   a measuring jig disposed on the support table or a table base for supporting the support table and having a flat lower surface, a parallel surface opposite and parallel to the lower surface, and a slanted surface joined to the parallel surface through a straight boundary line and inclined to the parallel surface, wherein:
   the boundary line is oriented in a direction parallel to the feed directions and positioned at a position where the parallel surface and the slanted surface are capable of simultaneously being observed in an observation zone of the white light interferometer, and while the linear motion mechanism is operated to linearly move the working unit and the measuring jig relatively to each other in one of the feed directions, the white light interferometer captures images of the parallel surface and the slanted surface of the measuring jig and observes changes in interference fringes appearing in image sections of the captured images that represent the parallel surface and the slanted surface.

3. The operation accuracy measuring system according to claim 2, wherein a gradient of the slanted surface with respect to the parallel surface of the measuring jig ranges from $1/15000$ to $1/5000$.

4. An operation accuracy measuring method for measuring operation accuracy of a linear motion mechanism in an apparatus that includes a support table having a support surface for supporting an object thereon, a working unit for processing the object supported on the support table, and the linear motion mechanism that linearly moves the working unit and the support table relatively to each other along feed directions, the operation accuracy measuring method comprising:
   a placing step of placing a measuring jig on the support table or a table base for supporting the support table, the measuring jig having a flat lower surface, a parallel surface opposite and parallel to the lower surface, and a slanted surface joined to the parallel surface through a straight boundary line and inclined to the parallel surface;
   an adjusting step of adjusting an orientation of the measuring jig to make the boundary line of the measuring jig parallel to the feed directions and adjusting positions of the measuring jig and a white light interferometer connected to the working unit to allow the white light interferometer to observe the parallel surface and the slanted surface simultaneously;
   an interference fringe observing step of, while the linear motion mechanism is operated to linearly move the working unit and the measuring jig relatively to each other in one of the feed directions, capturing images of the parallel surface and the slanted surface of the measuring jig with the white light interferometer and observing changes in interference fringes appearing in image sections of the captured images that represent the parallel surface and the slanted surface; and
   an operation accuracy deducing step of deducing the operation accuracy of the linear motion mechanism on a basis of the observed changes in the interference fringes.

5. The operation accuracy measuring method according to claim 4, wherein:
   the operation accuracy deducing step includes:
      deducing yawing accuracy as an element of the operation accuracy on a basis of a maximum change observed in a tilt angle of the interference fringes appearing in the image sections of the captured images that represent the slanted surface while the working unit and the measuring jig are being moved relatively to each other,
      deducing pitching accuracy as another element of the operation accuracy on a basis of a maximum change observed in brightness of the interference fringes appearing in the image sections of the captured images that represent the slanted surface while the working unit and the measuring jig are being moved relatively to each other, and
      deducing rolling accuracy as still another element of the operation accuracy by observing whether or not there are interference fringes appearing in the image sections of the captured images that represent the parallel surface or by observing changes in intervals between the interference fringes appearing in the image sections of the captured images that represent the slanted surface while the working unit and the measuring jig are being moved relatively to each other.

6. The operation accuracy measuring method according to claim 4, wherein a gradient of the slanted surface with respect to the parallel surface of the measuring jig ranges from $1/15000$ to $1/5000$.

* * * * *